(12) United States Patent
Hong et al.

(10) Patent No.: US 9,761,287 B2
(45) Date of Patent: Sep. 12, 2017

(54) SEMICONDUCTOR MEMORY DEVICE, MEMORY SYSTEM INCLUDING THE SAME AND OPERATING METHOD THEREOF

(71) Applicant: SK hynix Inc., Gyeonggi-do (KR)

(72) Inventors: Min Gi Hong, Gyeonggi-do (KR); Jin Su Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/291,725

(22) Filed: Oct. 12, 2016

(65) Prior Publication Data

US 2017/0032829 A1 Feb. 2, 2017

Related U.S. Application Data (62) Division of application No. 14/082,941, filed on Nov. 18, 2013, now Pat. No. 9,496,011.

(30) Foreign Application Priority Data

Aug. 7, 2013 (KR) .......................... 10-2013-0093756

(51) Int. Cl.
| | |
|---|---|
| *G11C 7/06* | (2006.01) |
| *G11C 7/10* | (2006.01) |
| *G11C 7/22* | (2006.01) |
| *G11C 7/20* | (2006.01) |
| *G11C 8/10* | (2006.01) |

(52) U.S. Cl.
CPC ............ *G11C 7/1087* (2013.01); *G11C 7/106* (2013.01); *G11C 7/1039* (2013.01); *G11C 7/1066* (2013.01); *G11C 7/1093* (2013.01); *G11C 7/20* (2013.01); *G11C 7/22* (2013.01); *G11C 8/10* (2013.01); *G11C 2207/229* (2013.01); *G11C 2207/2281* (2013.01)

(58) Field of Classification Search
CPC ........................................................ G11C 7/06
USPC ...................................................... 365/189.05
See application file for complete search history.

(56) References Cited

U.S. PATENT DOCUMENTS

| | | | | |
|---|---|---|---|---|
| 5,822,244 | A * | 10/1998 | Hansen | G06F 13/4239 365/185.11 |
| 2001/0011318 | A1* | 8/2001 | Dalvi | G06F 12/1433 711/103 |
| 2002/0144066 | A1* | 10/2002 | Talreja | G11C 16/10 711/154 |
| 2005/0024954 | A1* | 2/2005 | Dalvi | G06F 12/1433 365/199 |
| 2012/0008397 | A1* | 1/2012 | Shin | G11C 11/5628 365/185.11 |

* cited by examiner

*Primary Examiner* — Hoai V Ho
*Assistant Examiner* — Muna A Techane
(74) *Attorney, Agent, or Firm* — IP & T Group LLP (57) ABSTRACT

A semiconductor memory device includes a program and read unit suitable for programming program data in a memory cell array and for reading read data stored in the memory cell array, and a control unit suitable for generating a control signal for controlling the program and read unit in response to a command input from the outside of the semiconductor memory device, in which the control unit controls the program and read unit to read the read data in a state of storing a first bit data of the program data when a read command is input while programming the program data.

7 Claims, 5 Drawing Sheets

SEMICONDUCTOR MEMORY DEVICE, MEMORY SYSTEM INCLUDING THE SAME AND OPERATING METHOD THEREOF

CROSS-REFERENCE TO RELATED APPLICATION

This application is a division of U.S. patent application Ser. No. 14/082,941 filed on Nov. 18, 2013 which claims priority of Korean patent application number 10-2013-0093756, filed on Aug. 7, 2013. The disclosure of each of the foregoing application is incorporated herein by reference in its entirety.

BACKGROUND

Field of Invention

Various embodiments of the present invention relate to a semiconductor memory device, a memory system including the semiconductor memory device, and an operating method thereof.

Description of Related Art

A semiconductor memory device is a memory device implemented by using a semiconductor, such as silicon (Si) germanium (Ge) gallium arsenide (GaAs), and indium phosphide (InP). The semiconductor memory device is generally classified into a volatile memory device and a nonvolatile memory device.

The volatile memory device is a memory device losing stored data when a power supply is cut off. The volatile memory device includes a Static RAM (SRAM), a Dynamic RAM (DRAM) a Synchronous DRAM (SDRAM), and the like. The nonvolatile memory device is a memory device maintaining stored data even though a power supply is cut off. The nonvolatile memory device includes a Read Only Memory (ROM), a Programmable ROM (PROM), an Electrically Programmable ROM (EPROM) an Electrically Erasable and Programmable ROM (EEPROM), a flash memory, a Phase-change RAM (PRAM), a Magnetic RAM (MRAM), Resistive RAM (RRAM), a Ferroelectric RAM (FRAM) and the like. The lash memory is generally divided between a NOR type and a NAND type.

BRIEF SUMMARY

An embodiment of the present invention is directed to a semiconductor memory device capable of performing a fast operation by decreasing read latency in cases where a read command is input during a program operation.

An embodiment of the present invention provides semiconductor memory device including a program and read unit suitable for programming program data in a memory cell array and for reading read data stored in the memory cell array, and a control unit suitable for generating a control signal for controlling the program and read unit in response to a command input from the outside of the semiconductor memory device, in which the control unit controls the program and read unit to read the read data in a state of storing a first bit data of the program data when a read command is input while programming the program data.

Another embodiment of the present invention provides a memory system, including a semiconductor memory device suitable for storing program data and for reading read data and a controller suitable for controlling the semiconductor memory device in response to a command and the program data input from a host, in which the semiconductor memory device includes a program and read unit suitable for programming the program data in a memory cell array and for reading the read data stored in the memory cell array, and a control unit suitable for generating a control signal for controlling the program and read unit in response to the command provided from the controller, and when a read command is input during a program operation the program operation is stopped, and a read operation is performed in a state where a first bit data among the program data is stored in the program and read unit.

Yet another embodiment of the present invention provides a method of operating a semiconductor memory device, including programming first and second bits of program data using a program and read unit for a program operation, inputting a read command during the program operation performing a read operation using the program and read unit in response to the read command, wherein the read and write circuit stores the first bit of the program data and inputting the second bit of the program data and performing the program operation to start from an operation being performed when the read command is input.

According to the exemplary embodiments of the present invention, when a read command is input during a program operation, the program operation is stopped regardless of programming lower bit data, thereby decreasing read latency. A semiconductor memory device of the present invention includes a page buffer in a smaller size without a latch for separately storing data being programmed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DESCRIPTION OF EMBODIMENTS

Hereinafter, exemplary embodiments of the present invention will be described with reference to the accompanying drawings in detail. However, the present invention is not limited to an embodiment disclosed below and may be implemented in various forms and the scope of the present invention is not limited to the following embodiments. Rather, the embodiments are provided to more sincerely and fully disclose the present invention and to completely transfer the spirit of the present invention to those skilled in the art to which the present invention pertains, and the scope of the present invention should be understood by the claims of the present invention. Throughout the disclosure, reference numerals correspond directly to the like numbered parts in the various figures and embodiments of the present invention.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations, such as "comprises" or "comprising", will be understood to imply the inclusion of stated elements but not the exclusion of any other elements.

Figure 1:
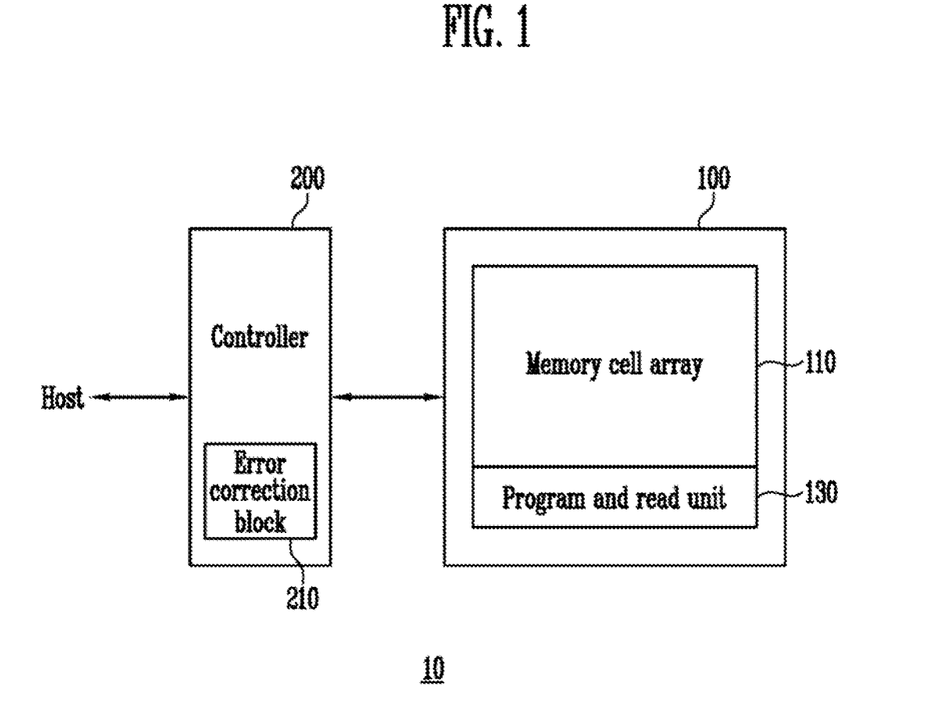
FIG. 1 is a block diagram illustrating a memory system including a semiconductor memory device.

FIG. 1 is a block diagram illustrating a memory system 10 including a semiconductor memory device 100.

Referring to FIG. 1, the memory system 10 includes the semiconductor memory device 100 and a controller 200. The semiconductor memory device 100 includes a memory cell array 110, and a program and read unit 130 coupled to the memory cell array 110.

The memory cell array 110 includes a plurality of memory cells. Each of the memory cells may be defined as a single level memory cell storing one data bit or a multi-level memory cell storing two or more data bits.

The semiconductor memory device 100 is operated under control of the controller 200. In response to a program command or a read command received from the controller 200, the semiconductor memory device 100 is configured to perform a program operation or a read operation on memory cells (selected memory cells) indicated by an address received together with the command.

For example, when the program command for the selected memory cells is received, the semiconductor memory device 100 receives input data, which is input from the outside and stored in the controller 200 and programs the received data on the selected memory cells.

Further, when the read command for the selected memory cells is received, the semiconductor memory device 100 performs the read operation on the selected memory cells and provides read data to the controller 200.

Further, when a suspend command is input from the controller 200 during the program operation, the semiconductor memory device 100 immediately stops the program operation being performed. Then, when the read command is received, the semiconductor memory device 100 performs the read operation on the selected memory cells in a state where lower bit data among the input data of the program operation is stored in some of latches of the program and read unit 130. Then, when a resume command is received the semiconductor memory device 100 provides higher bit data of the input data stored in the controller 200 to the program and read unit 130 and resumes an operation of programming the lower bit data stored in some of the latches of the program and read unit 130 and the higher bit data received from the controller 200 on the selected memory cells.

As an embodiment, the semiconductor memory device 100 may be a flash memory device. The lower and higher bit data may include least and most significant data. However, it will be understood that the scope of the present invention is not limited to the flash memory device.

The controller 200 is coupled between the semiconductor memory device 100 and a host. The controller 200 is configured to interface the host and the semiconductor memory device 100. For example, when the read or program operation is performed according to a request from the host, the controller 200 may convert a logical block address received from the host to a physical block address, and provide the semiconductor memory device 100 with the converted physical block address together with a corresponding command. Further, the controller 200 may temporarily store input data input from the host until the program operation is completed when the program operation is performed.

As an embodiment, the controller 200 may include an error correction block 210. The error correction block 210 is configured to detect and correct an error of data received from the semiconductor memory device 100. The error correction block 210 performs an error detection correction function according to the number of error bits in the data received from the semiconductor memory device 100. When the number of error bits in the data received from the semiconductor memory device 100 is less than a specific value, the error correction block 210 performs an error detection and correction function. When the number of error bits in the data received from the semiconductor memory device 100 is greater than the specific value, the error detection and correction function is not performed. The controller 200 controls the semiconductor memory device 100 to adjust a voltage applied to a selected word line.

Figure 2:
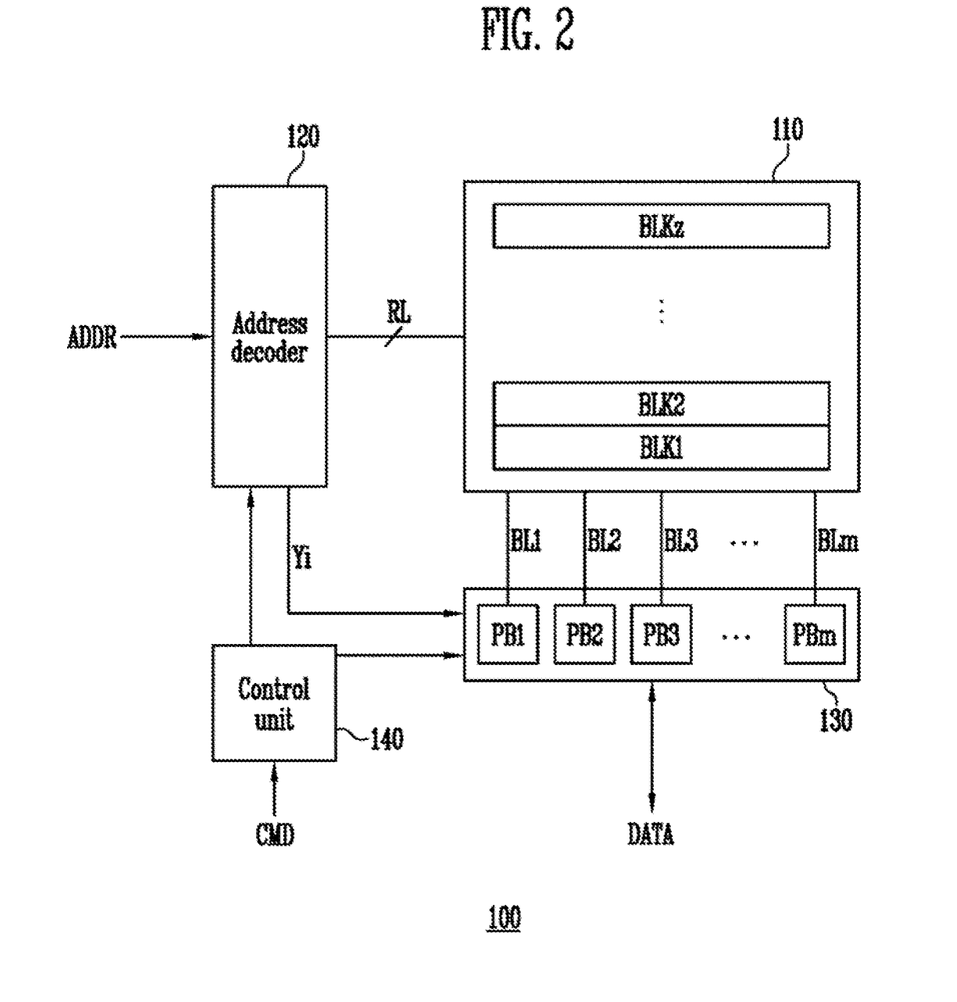
FIG. 2 is a block diagram illustrating the semiconductor memory device shown in FIG. 1 in more detail.

FIG. 2 is a block diagram illustrating the semiconductor memory device 100 of FIG. 1 in more detail.

Referring to FIG. 2, the semiconductor memory device 100 includes the memory cell array 110, an address decoder 120, the program and read unit 130, and a control unit 140.

The memory cell array 110 includes a plurality of memory blocks BLK1 to BLKz. The memory blocks BLK1 to BLKz are coupled to the address decoder 120 through row lines RL. The memory blocks BLK1 to BLKz are coupled to the program and read unit 130 through bit lines BL. Each of the memory blocks BLK1 to BLKz includes the memory cells. As an embodiment, the memory cells may be nonvolatile memory cells.

The address decoder 120, the program and read unit 130, and the control unit 140 are operated as peripheral circuits driving the memory cell array 110.

The address decoder 120 is coupled to the memory cell array 110 through the row lines RL. The address decoder 120 is configured to operate under control of the control unit 140. The address decoder 120 receives an address ADDR through an input/output buffer (not shown) in the semiconductor memory device 100. The address ADDR is provided from the controller 200 (see FIG. 1).

The address decoder 120 is configured to decode the received address ADDR and to generate a block address. The address decoder 120 selects at least one memory block according to the block address.

The address decoder 120 is configured to decode the received address ADDR and generate a row address. The address decoder 120 is configured to drive the row lines coupled to the selected memory block according to the row address.

The address decoder 120 is configured to decode the received address ADDR and to generate a column address. The address decoder 120 transmits the column address Yi to the program and read unit 130.

The read and program operation of the semiconductor memory device 100 is performed on pages as a unit. The address ADDR received when requesting the read and program operation includes the block address, the row address, and the column address. The address decoder 120 selects one memory block and one word line according to the block address and the row address. The column address is provided to the program and read unit 130 by the address decoder 120.

The address decoder 120 may include a block decoder, a row decoder a column decoder, an address buffer, and the like.

The program and read unit 130 includes a plurality of page buffers PB1 to PBm. The page buffers PB1 to PBm are coupled to the memory cell array 110 through the bit lines BL1 to BLm. The page buffers PB1 to PBm temporarily store input data DATA including the higher bit data and the lower bit data and provided from the controller 200 (see FIG. 1) during the program operation and program the selected memory cells according to the temporarily stored higher bit data and lower bit data. Further, the page buffers PB1 to PBm sense threshold voltage levels of the selected memory cells and temporarily store the 1$ sensed threshold voltage levels as read data DATA during the read operation and then transmits the temporarily stored read data DATA to the controller 200 (see FIG. 1).

When the suspend command input during the program operation the page buffers PB1 to PBm immediately stop the program operation being performed. Then, when the read command is received, the program and read unit 130 performs the read operation on the selected memory cells by using some of latches included in each of the page buffers PB1 to PBm, in a state where lower bit data among the input data of the program operation is stored in the rest of the latches. Then, when the resume command is received, the page buffers PB1 to PBm receive the higher bit data stored in the controller 200 again and temporarily store the received higher bit data, and resume the program operation for the selected memory cells by using the lower bit data stored in some latches and the higher bit data received from the controller 200.

The program and read unit 130 is operated under control of the control unit 140.

When the program is performed, the program and read unit 130 receives the input data DATA under control of the control unit 140 and stores the received input data DATA in the page buffers BP1 to PBm, and transmits the stored data DATA to bit lines indicated by the column address Yi among the bit lines BL. The transmitted data is programmed in the memory cells coupled to the selected word line. Further, when a program verification operation is performed, the program and read unit 130 identifies whether the program is completed by reading program states of the memory cells. When the read operation is performed the program and read unit 130 reads the data of the selected memory cells through the bit lines indicated by the column address Yi among the bit lines BL1 to BLm and stores the read data in the page buffers PB1 to PBm, and outputs the stored data DATA.

As an exemplary embodiment, the program and read unit 130 may include the page buffers (or page registers), a column selection circuit, and the like.

The control unit 140 is coupled to the address decoder 120 and the program and read unit 130. The control unit 140 receives a command CMD through the input/output buffer (not shown) of the semiconductor memory device 100. The command CMD is provided from the controller 200 (see FIG. 1). The control unit 140 is configured to control a general operation of the semiconductor memory device 100 in response to the command CMD. Further, when the suspend command is input during the program operation, the control unit 140 immediately stops the program operation being programmed by the program and read unit 130 regardless of a higher bit program operation and a lower bit program operation. Further, when the read command is input after the input of the suspend command, the control unit 140 temporarily stores the higher bit data of the input data stored in the program and read unit 130 in a flag latch to be described below, and performs the read operation by using the remaining main latch and cache latch.

Figure 3:
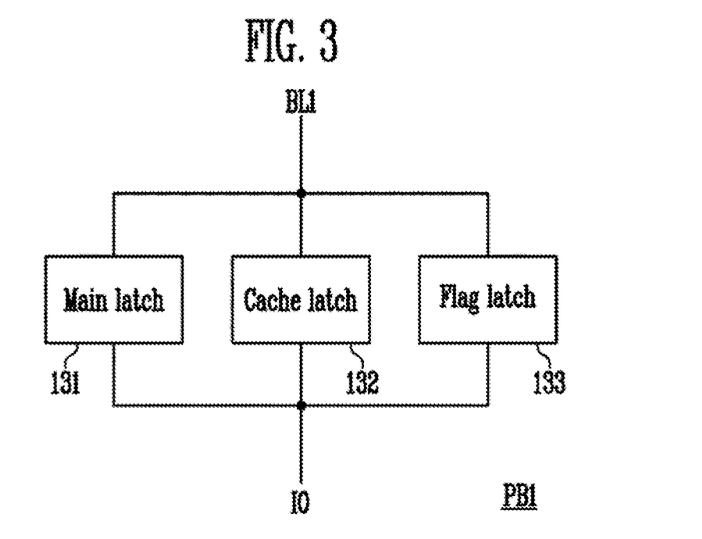
FIG. 3 is a block diagram illustrating one of page buffers shown in FIG. 2.

FIG. 3 is a block diagram illustrating one of the page buffers shown in FIG. 2.

Referring to FIG. 3, the page buffer PB1 includes a main latch 131, a cache latch 132, and a flag latch 133 coupled between the bit line BL1 and the input/output data line IO in parallel.

The main latch 131, the cache latch 132, and the flag latch 133 may temporarily store the data by latching the data transmitted through the input/output data line IO, and may control a potential of the bit line BL1 according to the stored data. The main latch 131, the cache latch 132, and the flag latch 133 may transmit the stored data to one another. Further, the main latch 131, the cache latch 132, and the flag latch 133 may latch verification data or read data by sensing the potential of the bit line BL1 and temporarily store the latched data and output the stored data to the controller 200 (see FIG. 1) through the input/output data line IO.

Figure 4:
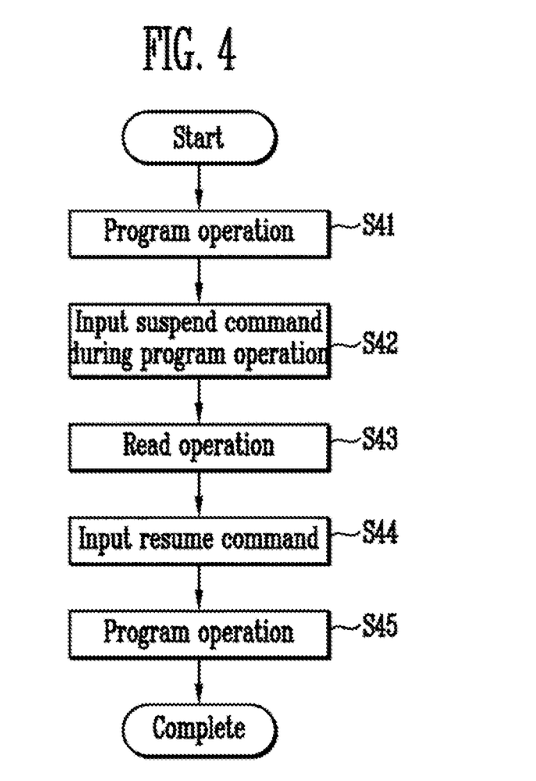
FIG. 4 is a flowchart illustrating an operation of the semiconductor memory device according to an embodiment of the present invention.

FIG. 4 is a flowchart illustrating an operation of the semiconductor memory device according to an embodiment of the present invention.

An operation method according to the present invention will be described below with reference to FIGS. 1 and 4.

1) Program Operation (S41)

When a program command is received from the controller 200, the semiconductor memory device 100 performs a program operation on memory cells (selected memory cells) indicated by an address received together with the command.

This will be described in more detail. The controller 200 receives the program command and the address from the outside, and provides the received program command and address to the semiconductor memory device 100. The control unit 140 of the semiconductor memory device 100 selects memory cells of the memory cell array 110 and controls the program and read unit 130 so that the program data input together with the address is transmitted to the page buffers PB1 to PBm of the program and read unit 130. In this case, the controller 200 temporarily stores the program data.

The program and read unit 130 programs the program data transmitted under control of the control unit 140 in the memory cell array 110.

The controller 200 divides the program data input from the outside to lower bit data and higher bit data and transmits the divided lower bit data and higher bit data to the page buffers PB1 to PBm of the program and read unit 130.

For example, when the higher bit data among the program data received by the controller 200 is transmitted to the cache latch 132 of the page buffers PB1 to PBm, the page buffers PB1 to PBm transmit the higher bit data temporarily stored in the cache latch 132 to the flag latch 133 and temporarily store the higher bit data in the flag latch 133. Then, the lower bit data among the program data received by the controller 200 is transmitted to the cache latch 132 of the page buffers PB1 to BPm and is temporarily stored in the cache latch 132.

Then, the lower bit data temporarily stored in the flag latch 133 is transmitted to the main latch 131 for the program operation of the lower bit data and the main latch 131 adjusts a potential level of the corresponding bit line BL1 according to the lower bit data stored in the main latch 131. The address decoder 120 programs selected memory cells by applying a program voltage to row lines coupled to a memory block selected according to a row address.

Then, the higher bit data temporarily stored in the cache latch 132 is transmitted to the main latch 131 for the program operation of the higher bit data, and the main latch 131 adjusts a potential level of the corresponding bit line BL1 according to the higher bit data stored in the main latch 131. The address decoder 120 programs selected memory cells by applying a program voltage to row lines coupled to a memory block selected according to a row address.

When a verification operation of the program operation of the lower bit data and the higher bit data is performed, the address decoder 120 applies a verification voltage to the row lines coupled to the memory block selected according to the row address and the page buffers PB1 to PBm verify the program operation by sensing the potential of the bit line by using the main latch 131 in which the lower bit data or the higher bit data is temporarily stored.

2) Input a Suspend Command During the Program Operation (S42)

Further, when a suspend command is input during the aforementioned program operation, the controller 200 immediately stops the program operation being performed by the program and read unit 130 regardless of a higher bit program operation and a lower bit program operation by controlling the control unit 140.

3) Read Operation (S43)

When a read operation is input after the input of the suspend command, the semiconductor memory device 100 performs a read operation on memory cells (selected memory cells) indicated by an address received together with the read command from the controller 200.

This will be described in more detail. The control unit 140 initializes the flag latch 133 by controlling the program and read unit 130 to delete the higher bit data temporarily stored during the program operation. Then, the lower bit data stored in the cache latch 132 during the program operation is transmitted to the flag latch 133 and temporarily stored in the flag latch 133. Further, the cache latch 132 is initialized.

Then, potentials of the bit lines BL1 to BLm are controlled to be changed according to the data stored in the memory cells by applying a read voltage to word lines of the selected memory cells, and read data is temporarily stored by sensing the potentials of the corresponding bit lines BL1 to BLm by using the main latch 131. The read data temporarily stored in the main latch 131 is transmitted to the cache latch 132 and temporarily stored in the cache latch 132.

The read data temporarily stored in the cache latch 132 of the page buffers PB1 to PBm is transmitted to the controller 200 through the input/output data line 10 to be output to the outside.

4) Input a Resume Command (S44)

When the read operation is completed and a resume command is input, the read data stored during the read operation is deleted by initializing the main latch 131 and the cache latch 132 of the page buffers PB1 to PBm. The lower bit data stored in the flag latch 133 is transmitted to the main latch 131, and then the flag latch 133 is initialized.

Then, the semiconductor memory device 100 receives the higher bit data among the program data temporarily stored in the controller 200 and temporarily stores the received higher bit data in the cache latch 132. The higher bit data stored in the cache latch 132 is transmitted to and stored in the flag latch 133.

Then the semiconductor memory device 100 transmits the lower bit data stored in the main latch 131 to the cache latch 132 and temporarily stores the lower bit data in the cache latch 132.

5) Program Operation (S45)

After the lower bit data and the higher bit data are stored in the cache latch 132 and the flag latch 133 of the page buffers PB1 to PBm during the resume command input operation S44, respectively, the program operation being performed in the aforementioned program operation S41 starts again. It starts from a program operation at the time at which the aforementioned program operation S41 is stopped.

As described above, according to the present invention, when the suspend command is input during the program operation so that the read operation is performed, the program operation is immediately stopped and the read operation is performed regardless of whether the program operation being performed is the higher bit program operation or the higher bit program operation. When the subsequent resume command is input, the higher bit data temporarily stored in the controller is stored in the page buffers again and then the program operation is performed, thereby improving read latency.

Figure 5:
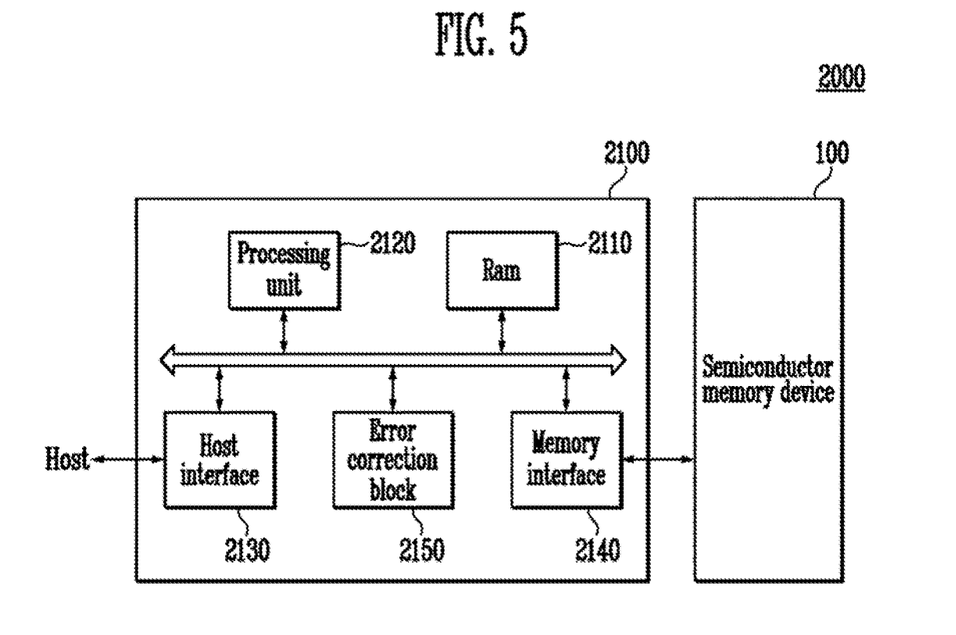
FIG. 5 is a block diagram illustrating another memory system including the semiconductor memory device of FIG. 1.

FIG. 5 is a block diagram illustrating a memory system 2000 including the semiconductor memory device 100 of FIG. 1.

Referring to FIG. 5, the memory system 2000 includes a semiconductor memory device 100 and a controller 2100.

The semiconductor memory device 100 may be configured and operated in a similar manner to that described with reference to FIG. 1. Hereinafter, overlapping descriptions will be omitted.

The controller 2100 is coupled to a host and the semiconductor memory device 100. The controller 2100 is configured to access the semiconductor memory device 100 in response to a request from the host. For example, the controller 2100 is configured to control read, write, erase, and background operations of the semiconductor memory device 100. The controller 2100 is configured to provide an interface between the semiconductor memory device 100 and the host. The controller 2100 is configured to drive a firm are for controlling the semiconductor memory device 100.

The controller 2100 includes a Random Access Memory (RAM) 2110, a processing unit 2120, a host interface 2130, a memory interface 2140, and an error correction block 2150, The RAM 2110 is used as at least one among a working memory of the processing unit 2120, a cache memory between the semiconductor memory device 100 and the host, and a buffer memory between the semiconductor memory device 100 and the host. The processing unit 2120 controls a general operation of the controller 2100. Further, the controller 2100 may temporarily store program data provided from the host during the write operation.

The host interface 2130 includes a protocol for performing a data exchange between the host and the controller 2100. As an exemplified embodiment, the controller 1200 is configured to communicate with the host through at least one of various interface protocols, such as a Universal Serial Bus (USB) protocol a Multimedia Card (MMC) protocol, a Peripheral Component Interconnection (PCI) protocol a PCI-express (PCI-E) protocol an Advanced Technology Attachment (ATA) protocol a Serial-ATA protocol, a Parallel-ATA protocol, a small computer small interface (SCSI)

protocol, an enhanced small disk interface (ESDI) protocol and an Integrated Drive Electronics (IDE) protocol, and a private protocol.

The memory interface 2140 interfaces with the semiconductor memory device 100. For example, the memory interface includes a NAND interface or a NOR interface.

The error correction block 2150 performs the same function as that of the error correction block 210 of FIG. 1. The error correction block 2150 is configured to detect and correct an error of the data received from the semiconductor memory device 100 by using an Error Correction Code (ECC) The processing unit 2120 may control the semiconductor memory device 100 to adjust a read voltage according to a result of the error detection of the error correction block 2150 and perform a re-read operation. As an exemplary embodiment, the error correction block may be provided as an element of the controller 2100.

The controller 2100 and the semiconductor memory device 100 may be integrated into one semiconductor device. As an exemplary embodiment, the controller 2100 and the semiconductor memory device 100 may be integrated into one semiconductor device to configure a memory card. For example, the controller 2100 and the semiconductor memory device 100 may be integrated into one semiconductor device to configure a memory card, such as a PC card (Personal Computer Memory Card International Association (PCMCIA)), a Compact Flash (CF) card, Smart Media Cards (SM, SMC) a memory stick, multimedia cards (MMC, RS-MMC, and MMCmicro), SD cards (SD, miniSD, microSD, and SDHC), and a Universal Flash Storage (UFS).

The controller 2100 and the semiconductor memory device 100 may be integrated into one semiconductor device to configure a semiconductor drive (Solid State Drive (SSD)). The semiconductor drive (SSD) includes a storage device configured to store data in a semiconductor memory. In cases where the memory system 2000 is used as the SSD, a speed of the operation of the host connected to the memory system 2000 may be remarkably improved.

For another example the memory system 2000 is provided as one of various constituent elements of an electronic device such as a computer, an ultra mobile PC (UMPC), a workstation, a net-book computer, personal digital assistants (PDA) a portable computer, a web tablet PC, a wireless phone, a mobile phone, a smart phone, an e-book reader, a portable multimedia player PMP), a portable game device, a navigation device, a black box, a digital camera, a 3-dimensional television, a digital audio recorder, a digital audio player, a digital picture recorder, a digital picture player, a digital video recorder, a digital video player, a device capable of transceiving information in a wireless environment, one of various electronic devices configuring a home network, a computer network, and a telematics network, an RFID device, or one of various constituent elements devices configuring a computing system.

For an exemplary embodiment, the semiconductor memory device 100 or the memory system 2000 may be mounted in various types of package. For example the semiconductor memory device 100 or the memory system 2000 may be packaged and mounted by a method, such as Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP) System In Package (SIP), Mufti Chip Package (MCP), Wafer-level Fabricated Package (WFP) and Wafer-Level Processed Stack Package (WSP).

Figure 6:
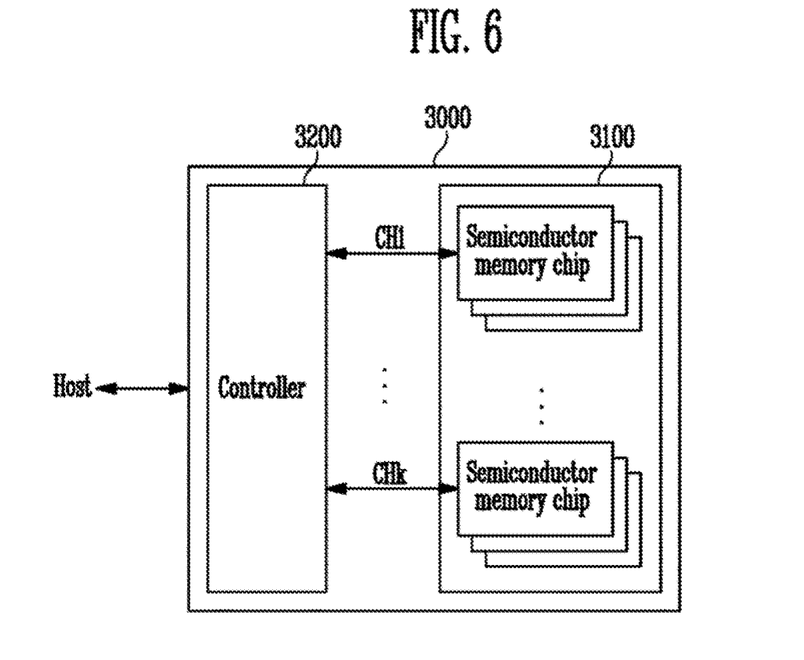
FIG. 6 is a block diagram illustrating an application example of the memory system of FIG. 5.

FIG. 6 is a block diagram illustrating an application example 3000 of the memory system 2000 of FIG. 5.

Referring to FIG. 6, the memory system 3000 includes a semiconductor memory device 3100 and a controller 3200. The semiconductor memory device 3100 includes a plurality of semiconductor memory chips. The semiconductor memory chips are divided into a plurality of groups.

In FIG. 6, it is illustrated that the groups communicate with the controller 3200 through first to $k^{th}$ channels CH1 to CHk, respectively. Each semiconductor memory chip may be configured and operated in a similar manner to the semiconductor memory device 100 described with reference to FIG. 1.

Each group is configured to communicate with the controller 3200 through one common channel. The controller 3200 is configured in a similar manner to the controller 2100 described with reference to FIG. 5, and is configured to control the memory chips of the semiconductor memory device 3100 through the channels CH1 to CHk.

In FIG. 6, it is described that the semiconductor memory chips are coupled to one channel. However, it will be understood that the memory system 3000 may be modified so that one semiconductor memory chip is coupled to one channel.

Figure 7:
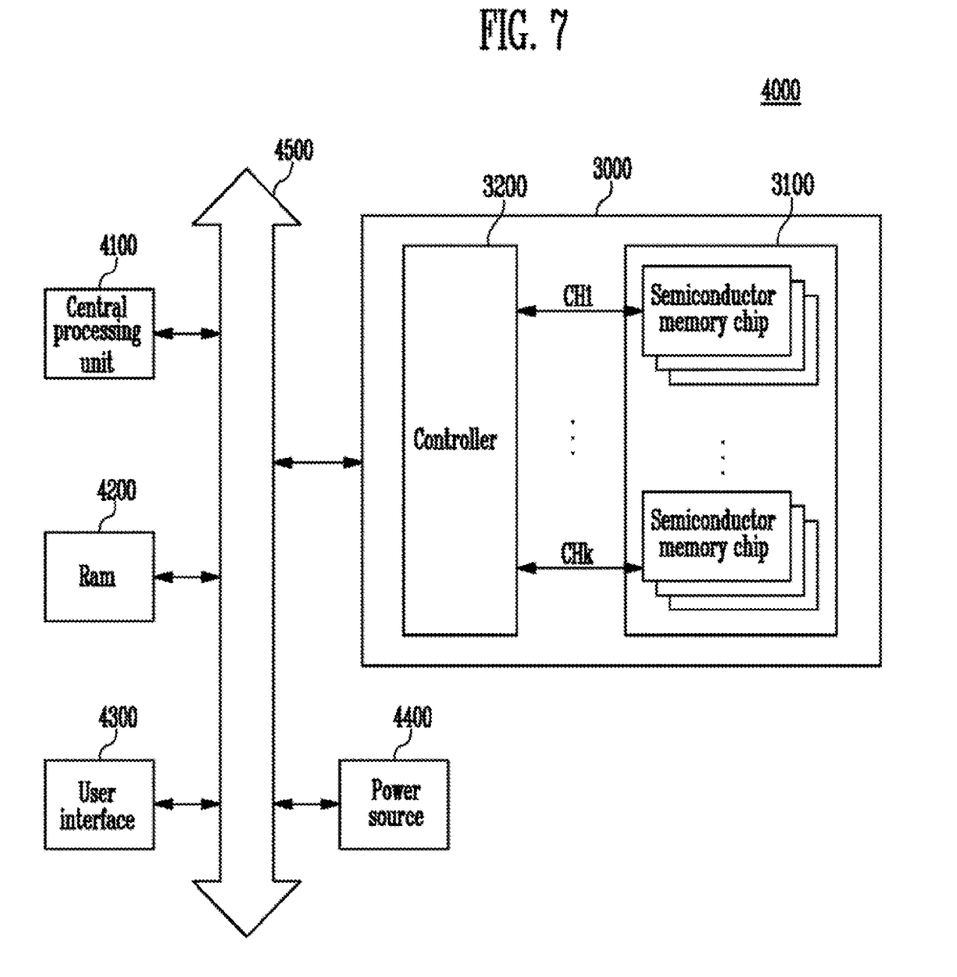
FIG. 7 is a block diagram illustrating a computing system including the memory system described with reference to FIG. 6.

FIG. 7 is a block diagram illustrating a computing system 4000 including the memory system 3000 described with reference to FIG. 6.

Referring to FIG. 7, the computing system 4000 includes central processing unit 4100, a Random Access Memory (RAM) 4200, a user interface 4300, a power source 4400, a system bus 4500, and the memory system 3000.

The memory system 3000 is electrically coupled to the central processing unit 4100, the RAM 4200, the user interface 4300, and the power source 4400 through a system bus 4500. Data provided through the user interface 4300 or processed by the central processing unit 4100 is stored in the memory system 3000.

In FIG. 7 it is illustrated that the semiconductor memory device 3100 is coupled to the system bus 4500 through the controller 3200. However, the semiconductor memory device 3100 may be directly coupled to the system bus 4500. In this case, the central processing unit 4100 and the RAM 4200 may function as the controller 3200.

In FIG. 7 is illustrated that the memory system 3000 described with reference to FIG. 6 is provided. However, the memory system 3000 may be substituted with the memory system 2000 described with reference to FIG. 5. As an exemplary embodiment, the computing system 4000 may include all of the memory systems 2000 and 3000 described with reference to FIGS. 5 and 6.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A memory system, comprising:
a semiconductor memory device configured to store program data and to read read data; and
a controller configured to control the semiconductor memory device in response to a command and the program data input from a host,
wherein the semiconductor memory device includes:
a plurality of page buffers each configured to include:
at least two latches to temporarily store the program data including a first bit data and a second bit data, respectively; and
at least one latch to temporarily store the first bit data or the second bit data of the program data, or to temporarily store the read data read from the memory cell array; and
a control unit configured to control the program and read unit to perform a read operation while maintaining the first bit data in one latch of the at least two latches if a read command is input while programming the program data.

2. The memory system of claim 1, wherein the at least two latches comprises:
a cache latch configured to store the first bit data among the program data input from the controller during the program operation;
a flag latch configured to store the second bit data among the program data during the program operation; and
wherein the at least one latch comprises
a main latch configured to receive the first or second bit data stored in the cache latch or the flag latch and controlling potentials of bit lines coupled with the memory cell array during the program operation.

3. The memory system of claim 2, wherein when a suspend command is input during the program operation, the control unit controls the program and read unit to transmit the first bit data stored in the cache latch to the flag latch to be stored therein and to initialize the main latch and the cache latch.

4. The memory system of claim 2, wherein the control unit controls the program and read unit to store the read data in the main latch by reading data of a selected memory cell in the memory cell array and transmit the read data to the cache latch to be output to the controller, during the read operation.

5. The memory system of claim 3, wherein when a resume command is input after the read operation, the control unit controls the program and read unit to transmit the first bit data stored in the flag latch to the main latch, to store the second bit data re-input from the controller in the flag latch, and to transmit the first bit data stored in the main latch to the cache latch.

6. The memory system of claim 5, wherein the control unit controls the program and read unit to resume the program operation to start from an operation being performed when the program operation is stopped, after the first bit data and the second bit data are temporarily stored in the program and read unit in response to the resume command.

7. The memory system of claim 1, wherein the controller temporarily stores the program data, and then provides the program data to the program and read unit.

* * * * *

UNITED STATES PATENT AND TRADEMARK OFFICE
CERTIFICATE OF CORRECTION

PATENT NO. : 9,761,287 B2
APPLICATION NO. : 15/291725
DATED : September 12, 2017
INVENTOR(S) : Min Gi Hong et al.

Page 1 of 1

It is certified that error appears in the above-identified patent and that said Letters Patent is hereby corrected as shown below:

On the Title Page

Change the Related U.S. Application Data section as follows:

(62) Division of application No. 14/082,941, filed on Nov. 18, 2013, now Pat. No. 9,601,169

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*